United States Patent [19]
Trofimenkoff et al.

[11] Patent Number: 5,877,637
[45] Date of Patent: Mar. 2, 1999

[54] RESISTANCE BRIDGE AND ITS USE IN CONVERSION SYSTEMS

[76] Inventors: Frederick N. Trofimenkoff, #30-3302 50th St. N.W., Calgary, Alberta, Canada, T3A 2C6; Faramarz Sabouri, #205-4004 19th St. N.W., Calgary Alberta, Canada, T2L 2B6; James W. Haslett, Box 5 Site 37 Rural Route 12, Calgary Alberta, Canada, T3E 6W3

[21] Appl. No.: 596,955

[22] Filed: Feb. 5, 1996

[51] Int. Cl.$^6$ ............................. G01B 7/00; H03K 3/02
[52] U.S. Cl. ..................... 327/101; 327/509; 327/512; 327/100; 327/336; 327/172; 73/766
[58] Field of Search ................................. 327/100, 101, 327/164, 131, 172, 105, 135, 138, 588, 512, 509, 513, 336; 73/766, 23.21; 422/96; 341/157; 324/691

[56] References Cited

U.S. PATENT DOCUMENTS

| | | | |
|---|---|---|---|
| Re. 32,631 | 3/1988 | Layer | 73/766 |
| 4,031,532 | 6/1977 | First | 327/101 |
| 4,417,477 | 11/1983 | Poff | 73/766 |
| 4,765,188 | 8/1988 | Krechmery et al. | 73/721 |
| 4,827,261 | 5/1989 | Troffmenkoff et al. | 341/157 |
| 4,847,620 | 7/1989 | Troffmenkoff et al. | 341/128 |
| 4,862,382 | 8/1989 | Schneider et al. | 327/101 |
| 5,088,330 | 2/1992 | Talmadge | 73/769 |

OTHER PUBLICATIONS

G.M. Swensen and R.L. Johnson "High–temperature pressure transducers." Sensors, vol. 12, No. 1. Jan., 1995.

T. Sidor, "Simple and accurate strain gauge signal–to–frequency converter," J. Phys. E: Sci. Instrum., vol. 16, 1983.

D.A. Kerth and D.S. Piasecki, "An oversampling converter for strain gauge transducers," IEEE J. Solid–State Circuits, vol. 27, No. 12, Dec. 1992.

R. Friedl and P. Seyfried, "A new resistance–to frequency converter for temperature measurements in calorimeters," IEEE Trans. Instrum. Meas., vol. IM–24, No. 4, Dec. 1975.

J.H. Huijsing, G.A. Van Rossum, and M. Van Der Lee, "Two–wire bridge–to–frequency converter," IEEE J. Solid–State Circuits, vol. SC–22, No. 3, Jun. 1987.

(List continued on next page.)

*Primary Examiner*—Dinh Le
*Attorney, Agent, or Firm*—Arnold White & Durkee

[57] ABSTRACT

An electrical network creates a differential voltage signal and comprises a plurality of first impedance elements of substantially equal values which are connected to form an impedance bridge. The impedance of at least one of the first impedance elements changes in response to at least one selected external condition to which the first impedance elements are exposed. The network also comprises a second impedance element which has two nodes. The second impedance element is connected at these nodes between a first pair of the first impedance elements. The differential voltages are measured between these nodes and between another node or nodes with magnitudes and signs being dependent upon the change in the impedance of the first impedance elements.

17 Claims, 13 Drawing Sheets

OTHER PUBLICATIONS

H> A. Leopold, G. Winkler, P. O'leary, K. Ilzer, and J. Jernej, "A monolithic CMOS 20–bity analog–to–digital converter," IEEE J. Solid=State Circuits, vol. 26, No. 7, Jul. 1991.

Jr. P.C. Dow, "An analysis of certain errors in electronic differential analyzers, II–capacitor dielectric absorption" IRE Transactions of Electronic Computers, 1958.

J.N. Babanezhad and R. Gregorian, "A programmable gain/loss circuit," IEEE J. Solid–State Circuits, vol. SC–22, No. 6, Dec. 1987.

D.B. Ribner and M.A. Copeland, "Design techniques for cascoded CMOS op amps with improved PSRR and common–mode input range," IEEE J. Solid–State Circuits, vol. SC–19, No. 6, Dec. 1984.

M. Steyaert and V. Comino, "High speed accurate CMOS comparator", Electron, Lett., vol. 24, No. 16, Aug. 1988.

V. Comino, M.S.J. Steyaert, and G.C. Temes, "A first–order current–steering sigma–delta modulator," IEEE J. Solid–State Circuits, vol. SC–26, No. 3, Mar. 1991.

D.A. Kerth and D.S. Piasacki, "An Oversampling Converter for Strain Gauge Transducers," IEEE International Solid–State Circuits Conference, ISSCC 92/Session 2 Data Conversion, 1992.

Gert J.A. van Dijk and Johan H. Huijsing, "Bridge–Output–to–Frequency Converter for Smart Thermal Air–Flow Sensors," IEEE Transactions on Instrumentation and Measurement, vol. 44, No. 4, Aug., 1995, pp. 881–886.

J. Williams, "AC–driven bridge circuits suit specific applications," EDN, No. 8, Nov., 1990, pp. 229–238.

E.O. Doebelin, Measurement Systems: Application and Design, McGraw–Hill Publishing Company, 1990, ch. 10, pp. 751–767.

Gregg M. Swenson "High Temperature Electronics and Transducers" HITEN News, High Temperature Electronic Network, No. 005, Mar. 1995.

RESISTANCE BRIDGE AND ITS USE IN CONVERSION SYSTEMS

FIELD OF INVENTION

The present invention relates to resistance bridges. More specifically, the invention concerns the use of resistance bridges with pulse-forming circuits.

BACKGROUND

The development of bridge transducers with long-term stabilities of the order of 0.02 percent of full scale over a temperature range of −55° C. to 225° C. has created a demand for high resolution δR-to-digital conversion systems with commensurate long-term stabilities over these temperatures.

In a conventional Wheatstone bridge transducer, illustrated in FIG. 1, an outside quantity, such as pressure or temperature, causes a change in resistance, δR, in some or all of the bridge resistors, 10, 11, 12 and 13. These resistors can be arranged in such a way that the measured quantity changes the resistances of all or some of the resistors by about the same magnitude, δR, but in directions that give an additive output. For example, if the resistance of resistors 10 and 13 changes to R−δR and the resistance of resistors 11 and 12 changes to R+δR, the differential output voltage of such a bridge powered by a dc voltage $V_{ref}$ will be $$V_{od} = \frac{\delta R}{R} V_{ref}. \quad (1)$$

In pressure transducers, the full-scale of $V_{od}$ is usually less than one percent of $V_{ref}$. Therefore, if the small output voltage of the bridge is applied directly to an N-bit analog-to-digital converter with an input range of 0 to $V_{ref}$, the conversion resolution will not be better than (N−7) bits.

To obtain higher resolutions, $V_{od}$ in FIG. 1 must be amplified to a level comparable to the full-scale input range of the analog-to-digital converter. For example, the output of the bridge of FIG. 1 can be amplified using the single amplifier bridge balancing circuit shown in FIG. 2 or by using an instrumentation amplifier as shown in FIG. 3. However, even if modern auto-zeroing operational amplifiers ("op-amps") are used in these circuits, gain control resistors (resistors 22 and 23 in FIG. 2 and 34, 35, 36, and 37 in FIG. 3) some of whose values will normally be larger than the bridge arm resistors are required. These resistors would have to be of high quality with low temperature coefficients and low tracking temperature coefficients. Even then, they are subject to long-term drift at high temperatures and this drift affects the long-term stability of the overall measurement system.

Therefore, a need exists for a bridge transducer network producing differential output voltages with magnitudes and signs such that the network can be attached directly to a δR-to-digital conversion system.

Conversion systems which use the circuits of FIGS. 2 and 3 have performances dependent on passive or active component values. Therefore, a need exists for a resistance bridge δR-to-frequency conversion system with performance independent of most passive or active component parameter variations.

Furthermore, conventional bridge conversion systems which use the circuits of FIGS. 2 and 3 do not provide good noise rejection. Therefore, a need exists for a conversion system with good noise rejection.

Conventional conversion systems are not stable at high temperatures and are susceptible to component aging.

Therefore, a resistance bridge δR-to-digital conversion system is needed that is stable over a wide temperature range and relatively immune to component aging.

Furthermore, a need exists for a resistance bridge δR-to-digital conversion system with the above properties but in integrated form.

SUMMARY OF THE INVENTION

It is an object to provide a resistance bridge transducer which produces differential output voltages with magnitudes and signs such that the bridge can be used directly with δR-to-digital conversion systems.

It also is an object of the invention to provide a charge balancing resistance bridge δR-to-digital conversion system with a performance independent of most passive and active component parameter variations.

Another object of the invention is to a provide a conversion system with good resolution and noise rejection.

A further object of the invention is to provide a resistance bridge δR-to-digital conversion system that is stable with temperature and relatively immune to component aging.

Yet another object of the present invention is to provide a resistance bridge δR-to-digital conversion system with the above properties but in an integrated form. Other aspects and advantages of the present invention may become apparent upon reading the following detailed description and upon reference to the drawings.

In accordance with the present invention, the foregoing objectives are realized by an electrical network for providing differential voltage signals. The network comprises a plurality of first impedance elements of substantially equal values which are connected to form an impedance bridge. The impedance of at least one of the first impedance elements changes in response to at least one selected external condition to which the first impedance elements are exposed. The network also is comprised of a second impedance element with two nodes, said second impedance element connected at said nodes between a first pair of said first impedance elements and providing differential voltages at said nodes, the magnitudes and signs of said differential voltages being dependent upon said change in the impedance of said first impedance elements.

DESCRIPTION OF THE PREFERRED EMBODIMENTS

Several illustrative embodiments of an improved resistance bridge and its use in $\delta R$-to digital conversion systems are described below as they might be implemented to provide for improved conversion systems. In the interest of clarity, not all features of an actual implementation are described in this specification. It will of course be appreciated that in the development of any such actual implementation (as in any development project), numerous implementation-specific decisions must be made to achieve the developers' specific goals and subgoals, such as compliance with system- and business-related constraints, which will vary from one implementation to another. Moreover, it will be appreciated that such a development effort might be complex and time-consuming, but would nevertheless be a routine undertaking of device engineering for those of ordinary skill having the benefit of this disclosure.

Figure 1:
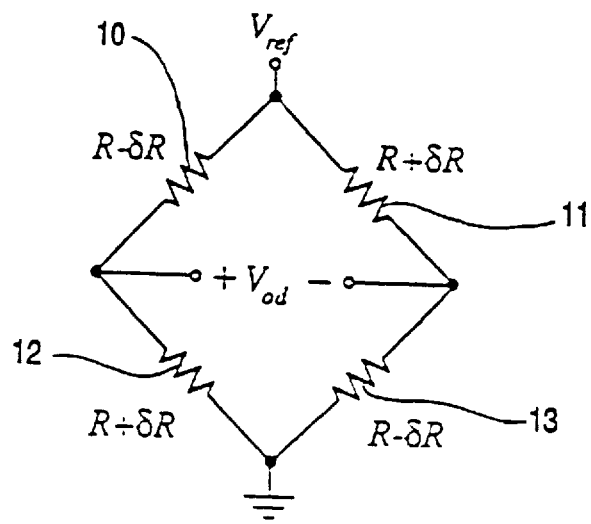
FIG. 1 shows a schematic diagram of a resistance bridge of the prior art.
Figure 2:
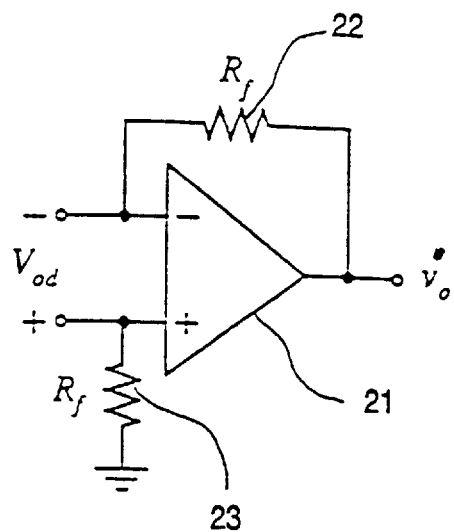
FIG. 2 shows a schematic diagram of an amplifier of the prior art.
Figure 3:
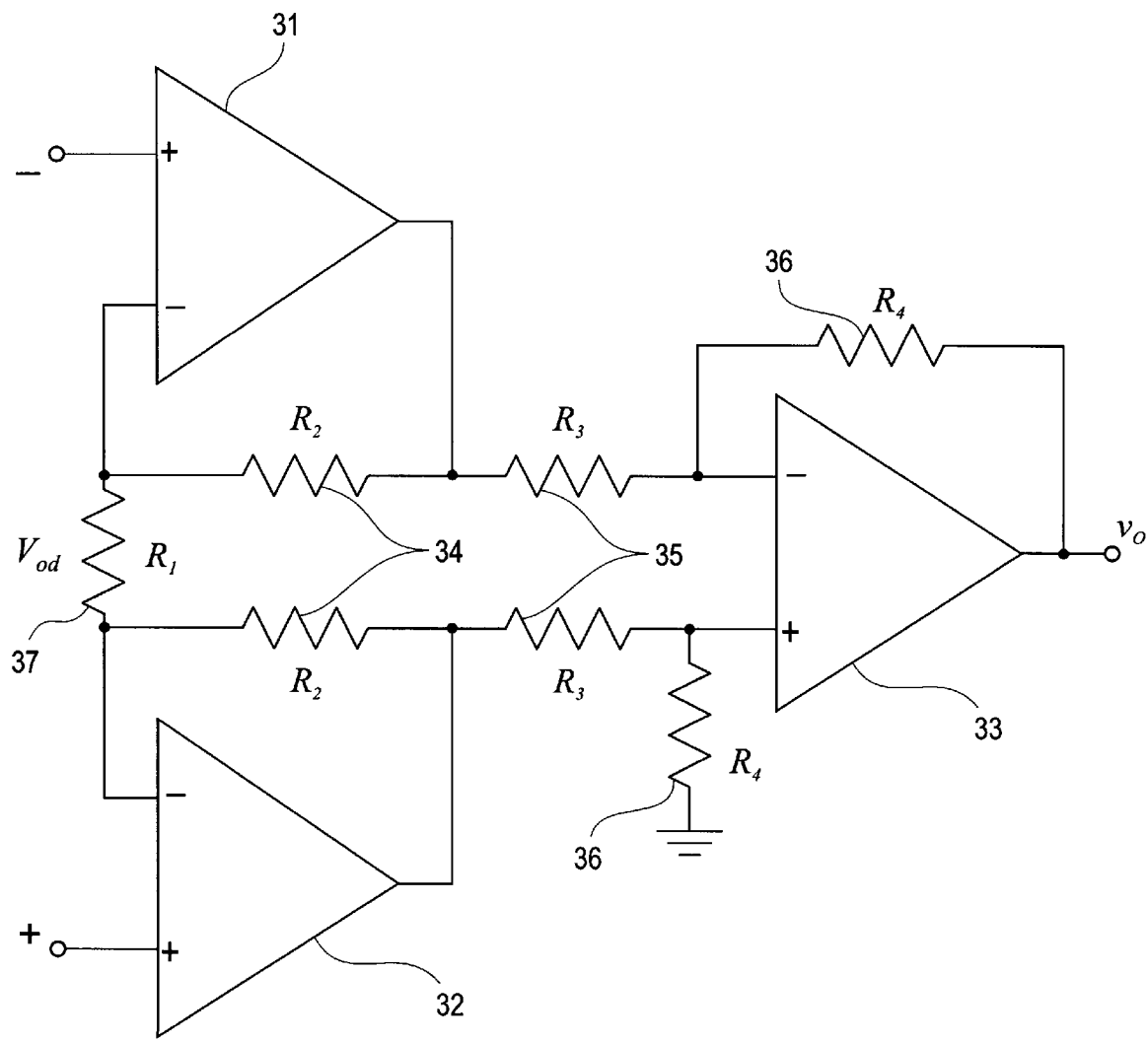
FIG. 3 shows a schematic diagram of an amplifier of the prior art.
Figure 4:
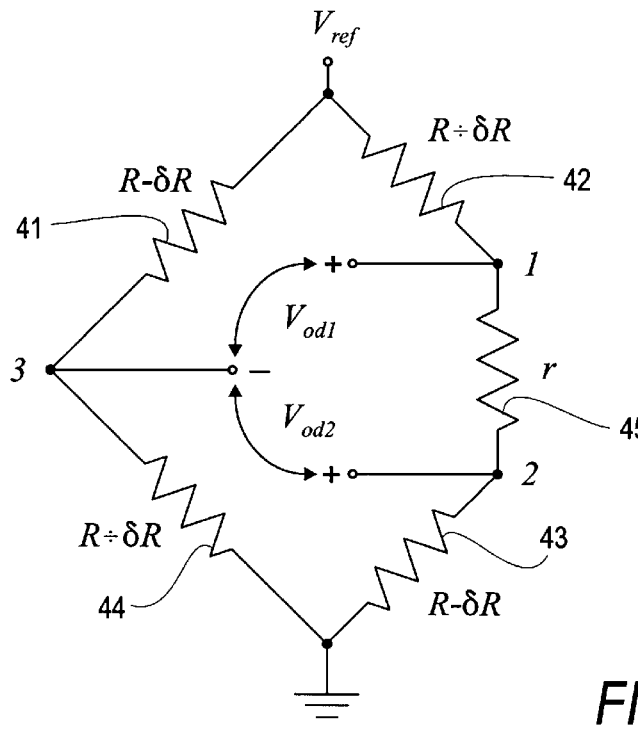
FIG. 4 is a schematic diagram of an electrical network according to the principles of the invention.

In accordance with principles of the present invention, for the purpose of creating two differential voltages $V_{od1}$ and $V_{od2}$, a resistor 45 is mounted between resistors 42 and 43 of a conventional Wheatstone bridge as shown in FIG. 4. A supply voltage is applied to one node of the bridge between resistors 41 and 42 while the node between resistors 43 and 44 is connected to ground.

When a measurable quantity creates a $\delta R$ in each resistor in the bridge, the bridge circuit of FIG. 4 produces a voltage $V_{od1}$ which is $$V_{od1} = \frac{V_{ref}(R - \delta R + r)}{2R + r} - \frac{V_{ref}(R + \delta R)}{2R} \quad (2)$$

and a voltage $V_{od2}$ which is $$V_{od2} = \frac{V_{ref}(R - \delta R)}{2R + r} - \frac{V_{ref}(R + \delta R)}{2R} \quad (3)$$

where R is the resistance of bridge arm resistors 41, 42, 43, and 44 and r is the resistance of resistor 45, and $V_{ref}$ is the magnitude of the supply voltage.

The resistor 45 has a resistance substantially less than the bridge arm resistors 41, 42, 43 and 44. For example, the resistor 45 has a resistance of the order of one percent or less of the resistance of the bridge arm resistors 41, 42, 43, and 44 and can therefore be fabricated for example, directly on a pressure transducer diaphragm for close temperature coefficient matching with the bridge arm resistances.

The voltages given by (2) and (3) will be small compared with $V_{ref}$, but will, nevertheless, be of sufficient magnitude and sign such that the bridge can be connected directly to conversion systems. The details of these conversion systems are described below.

Figure 5:
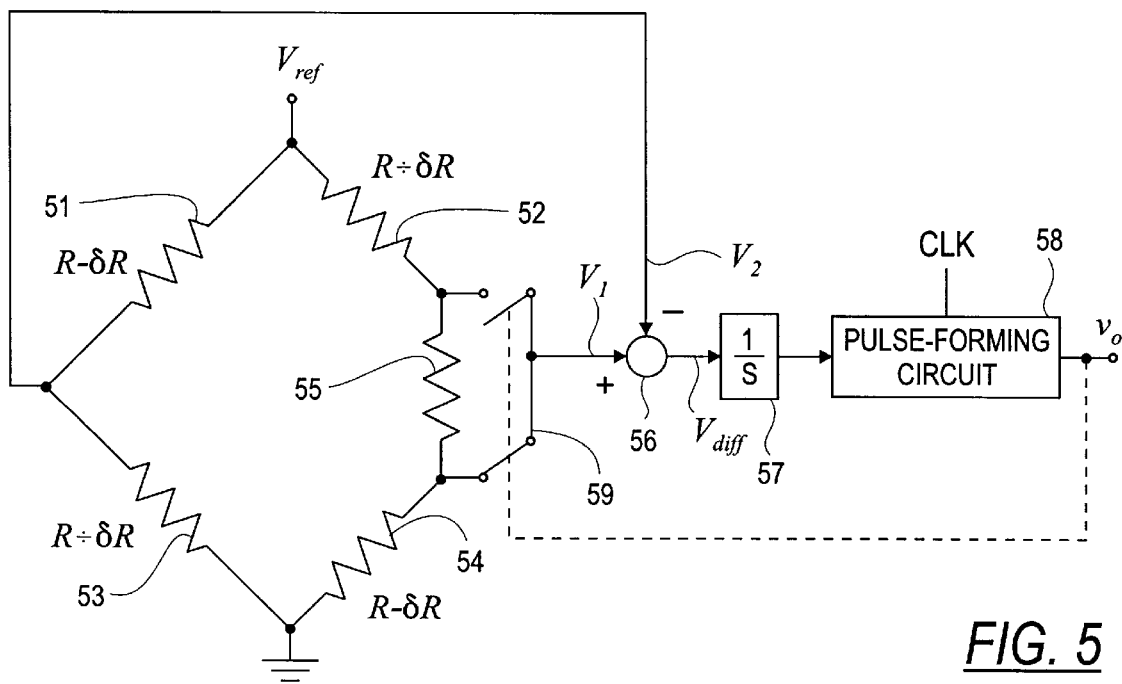
FIG. 5 is a schematic diagram of a resistance bridge δR-to-digital converter according to the principles of the invention.

In accordance with further aspects of the present invention, the modified bridge of FIG. 4 may be attached to a clock-controlled charge balancing modulator The resistor 45 has a resistance substantially less than the bridge arm resistors 41, 42, 43 and 44. circuit, as illustrated in FIG. 5. The modified bridge produces voltages $V_{od1}$, and $V_{od\ 2}$ given by (2) and (3).

As shown in FIG. 5, summer 56 creates a differential voltage $V_{diff}$ by combining two input voltages, $V_1$ and $V_2$. Voltage $V_1$ is chosen by switch 59 and will alternatively be one of two voltages depending upon the position of switch 59. Voltage $V_2$ originates from the node located between bridge arm resistors 51 and 53.

Integration circuitry 57 then integrates the differential voltage, which is one of $V_{od1}$ or $V_{od2}$. If $V_{diff}$ consists of steady dc values, the output of the integration circuitry 57 will be a triangular waveform. Pulse forming circuitry 58 then forms a series of digital pulses from the output of the integration circuitry 57. The pulse-forming circuitry 58 can be a voltage-to-frequency converter, a pulse width modulator (PWM), or a dual-threshold pulse-forming circuit. In each of these circuits, the mark-to-period ratio is related to $\delta R$. The pulse-forming circuit 58 then synchronizes the digital waveform to a high frequency clock, CLK. As will be discussed in greater detail below, bridge supply switching can be conveniently used with a clock-controlled PWM to obtain an adequate representation of $\delta R$ minimizing the effects of nonidealities in the circuit.

Thus, the bridge portion of FIG. 5 provides differential voltages of magnitude sufficient for direct operation of the bridge with the pulse-forming circuit 58.

Figure 6A:
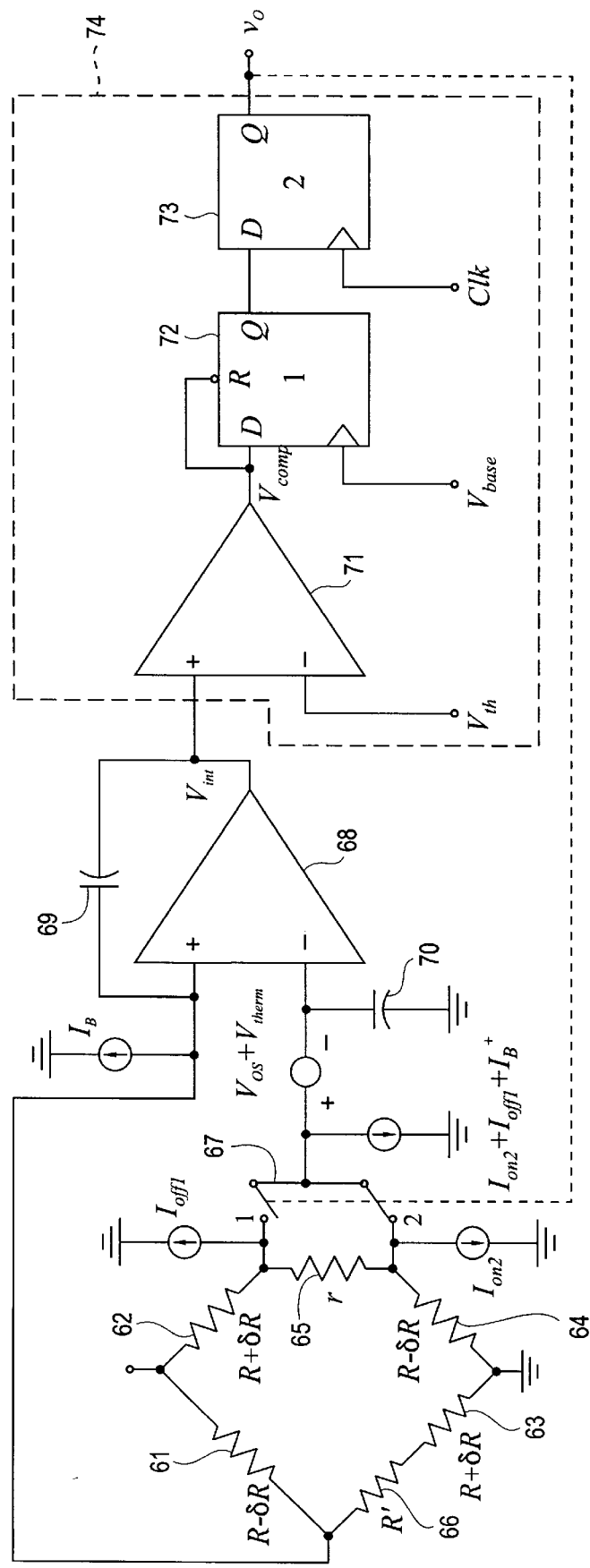
FIG. 6a is a schematic diagram of a resistance bridge δR-to-digital converter according to the principles of the invention.

Another embodiment of a conversion system which uses a PWM according to aspects of the present invention is shown in FIG. 6a. Resistors 61–65 operate to create differential voltages $V_{od1}$ and $V_{od2}$ in the same manner as described for resistors 41–45 in FIG. 4 and with values given by (2) and (3). Resistor 66 adjusts $V_{od1}$ and $V_{od2}$ such that these voltages will be in the correct range of operation for the pulse-forming circuit which is generally shown at 74. Normally, resistor 66 has a resistance less than one percent of the bridge arm resistors 61, 62, 63, and 64.

A switch 67 chooses one of the two differential voltages $V_{od1}$ or $V_{od2}$ for application to the differential integrator terminals. The switch 67 is controlled by $V_o$. When $V_o$ is at a low voltage (a "zero"), the switch 67 is in position 1 and selects $V_{od1}$. Alternately, when $V_o$ is at a high voltage level (a "one"), the switch 67 is in position 2 and selects $V_{od2}$.

In order to integrate the differential voltage provided by switch 67, a capacitor 69 is connected between the negative terminal and output terminal of op-amp 68. Current flows out of capacitor 69 toward the negative terminal of op-amp 68 when $V_{od1}$ is connected via the switch to the positive input terminal of op-amp 68. With switch 67 in this position, $V_{int}$ ramps in an upward direction. On the other hand, current flows into the capacitor 69 when $V_{od2}$ is connected via the switch 67 to the input of the integrator op-amp 68. With switch 67 in this position, $V_{int}$ ramps in a downward direction. Capacitor 70 cancels a zero formed in the transfer function of the differential integrator arrangement formed by capacitor 69 and op-amp 68. Preferably, capacitors 69 and 70 form equal time constants with their resistances.

For the purpose of creating digital signals, the integrator output is fed generally to pulse-forming circuit 74 and, specifically, within pulse-forming circuit 74, to a comparator 71. The comparator 71 creates a digital waveform by changing its output $V_{comp}$ as the input $V_{int}$ to its positive terminal crosses and recrosses a threshold voltage. Preferably, the threshold voltage is one-half of the supply voltage.

In order to determine the period of the digital waveform, the output $V_{comp}$ of comparator 71 is applied to a first flip-flop 72. The flip-flop 72 is a D flip-flop with a clock input $V_{base}$ whose period is an integer multiple of the high frequency clock, CLK. The output of flip-flop 72 has period equal to $T=1/f_{PWM}$, where T is an integer multiple of the high-frequency clock period.

For the purpose of synchronizing the digital pulses at the output of flip-flop 72 to the system clock, the output of the first flip-flop 72 is applied to a second flip-flop 73. Second flip-flop 73 is also a D flip-flop with its clock input being a high frequency clock CLK. The low-to-high and high-to-low transitions of $V_o$ are thus synchronized to a high frequency clock, CLK, and are controlled by the rising edge of $V_{base}$ and the falling edge of $V_{comp}$, respectively.

The circuit of FIG. 6a generates a waveform, $V_o$, with a fixed period and varying duty cycle. For the mark duration, M, the charging switch is in position 2 and the input to the modulator is $V_{od2}$. For the rest of the period, T–M, the charging switch is in position 1 and the input to the modulator is $V_{od1}$. Therefore, the charge balance condition for capacitor 69 can be expressed as $$\left( \frac{R + \delta R + R'}{2R + R'} - \frac{R - \delta R}{2R + r} \right) M = \qquad (4)$$

$$\left( \frac{R + r - \delta R}{2R + r} - \frac{R + \delta R + R'}{2R + R'} \right)(T - M).$$

where R' is the resistance of resistor 66, R is the resistance of the bridge arm resistors, and r is the resistance of resistor 65. In the ideal case, the average duty cycle of the modulator output, $V_o$, measured over a sufficiently long period of time, will be $$\overline{\left( \frac{M}{T} \right)}_{ideal} = \qquad (5)$$

$$\frac{1}{2} - \frac{(1 - R'/r)}{(1 + R'/2R)} - \frac{1}{R + R'/2} \left( \frac{2R}{r} + \frac{R'}{2r} + \frac{1}{2} \right) \delta R$$

and $\overline{(M/T)}_{ideal}$ is therefore linearly dependent on $\delta R$. Equation (5) can be used to select resistors 65 and 66 to use as much of T/2 for M as $\delta R$ goes from 0 to $(\delta R)_{max}$ as is practical. It should be noted that this pulse-width modulator operates in the desired manner only when $0 < M/T < \frac{1}{2}$. This can be arranged by making M=3T/8, for $\delta R$=0 and M=T/8, for $\delta R=(\delta R)_{max}$. These values leave a margin for operating point shifts due to input offset voltage, thermoelectric voltages, bias currents, switch leakage currents and perhaps some unbalance in the bridge resistors.

The system of FIG. 6a has a performance independent of most passive component parameter variations. Therefore, it is suitable for operation over a wide variety of temperatures.

The differential voltages given by (2) and (3) and produced by the bridge circuit of FIG. 6a will be small compared with $V_{ref}$, but the bridge portion of FIG. 6a, nevertheless, provides differential voltages with sufficient magnitudes and signs to allow direct operation of the bridge portion with the PWM portion as shown in FIG. 6a.

For the circuit of FIG. 6a, errors in the conversion of the $\delta R$ to a digital signal are present. The full-scale error in the conversion of $\delta R$ to a digital signal is defined by $$\epsilon_{full-scale} \left[ \overline{\left( \frac{M}{T} \right)}_{act} - \overline{\left( \frac{M}{T} \right)}_{ideal} \right] / \overline{\left( \frac{M}{T} \right)}_{full-scale} \qquad (6)$$

where $\overline{(M/T)}_{act}$ is the actual value of the average duty cycle considering modulator errors, $\overline{(M/T)}_{ideal}$ is the ideal value of the average duty cycle expressed by (5), and $\overline{(M/T)}_{full-scale}$ is the full scale value of the average duty cycle which is 0.5 for the pulse-width modulator of FIG. 6a.

Thermoelectric voltage generated in the bridge ($V_{therm}$), and the input offset voltage ($V_{os}$) and the input bias currents ($I_B^+$, $I_B^-$) of the op-amp, are error sources that should be considered in the charge balance equation for capacitor 69. The error in the duty cycle of the modulator output due to these nonidealities can be expressed as $$\epsilon_{full-scale} \cong -\frac{(V_{os} + V_{therm})}{V_{ref}} \left( \frac{2R}{r} + 1 \right) - \qquad (7)$$

$$\frac{I_{os} R}{V_{ref}} \left( \frac{R}{r} + \frac{3}{4} \right) - \frac{I_B R}{2 V_{ref}}$$

where $I_B=(I_B^+ + I_B^-)/2$ and $I_{os}+(I_B^+ - I_B^-)$. The finite common mode rejection ratio (CMRR) of the op-amp results in an error given by $$E_{full-scale} \cong -\frac{1}{CMRR} \left( \frac{R}{r} + 1 - \frac{\delta R}{r} \right) \qquad (8)$$

The error due to the finite dc gain, $A_o$, of the op-amp can be expressed as $$\epsilon_{full-scale} \cong -\frac{1}{A_0} \left( \frac{2T}{RC_1} \overline{\left( \frac{M}{T} \right)}_{ideal} + 1 \right) \qquad (9)$$

where $\overline{(M/T)}_{ideal}$ is the ideal value of the average duty cycle of the output waveform represented by (5) and $C_1$ is the capacitance of capacitor 69.

Figure 6B:
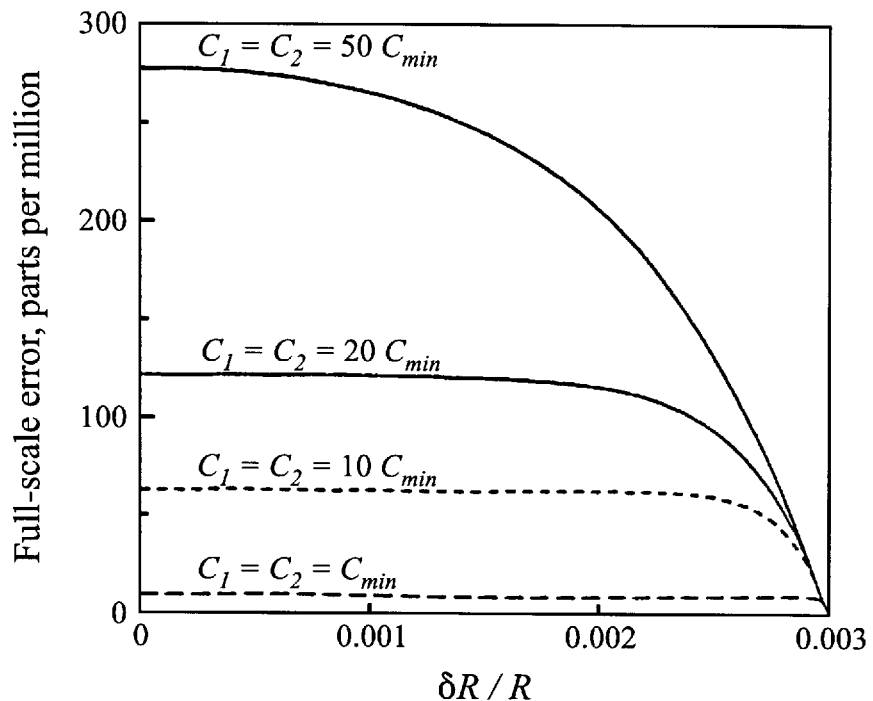
FIG. 6b is a graph of the full-scale error due to mismatch in the "on" resistance of charging switches.

The analog switches used to switch $V_{od1}$ and $V_{od2}$ to the input of the modulator (charging switches) can have different "on" resistances. In the configuration shown in FIG. 6a, the mismatch between the "on" resistance of the switches leads to unequal charging and discharging time constants for the capacitor 70. As a result, the dc voltage developed on the noninverting input of the op-amp will be slightly different from the ideal value obtained with equal charging and discharging time constants. Mismatch in the "on" resistances of the charging switches leads to an error in the average output duty cycle for the above circuit as shown in FIG. 6b. This error can be reduced to a small value by reducing the capacitance of capacitor 69 to a minimum value, $C_{min}$, determined by the maximum allowable swing at the output of the integrator ($V_{ref}/2$). This value is $$C_{min} = \frac{T}{R(2R/r + 1)} \quad (10)$$

It can be shown that for time constants that are small compared to T, the maximum full-scale error can be expressed as $$\epsilon_{full-scale,max} \cong \frac{2\Delta R_{on} C_2}{T} \quad (11)$$

where $\Delta R_{on}$ is the mismatch between the "on" resistance of the charging switches 1 and 2 and $C_2$ is the capacitance of capacitor 70.

Leakage currents of the switches are also a source of error, particularly at high temperatures. Assuming that resistors 61, 62, 63, and 64 have values much greater than resistor 65 and resistor 66, and switch leakage currents are $I_{off1}=I_{off2}=I_{off}$ and $I_{on1}=I_{on2}=I_{on}$, it can be shown that the error is given by $$\epsilon_{full-scale} \cong -\frac{4R}{r} \times \frac{R(I_{off} + I_{on})}{V_{ref}} \quad (12)$$

It is clear from this equation that the effect of leakage currents is amplified by the signal gain (2R/r).

Each transition in the modulator output voltage has a delay with respect to the leading edge of the high-frequency clock CLK. However, only a differential delay due to a pair of rising and falling edges leads to an error in the modulator performance. The full-scale error due to a differential temporal error, $\Delta t$, can be expressed as an offset error given by $$\epsilon_{full-scale} = \frac{\Delta t}{T} \quad (13)$$

The voltage difference across resistor 65 results in different transition delays of the two charging switches in going from the "on" state to the "off" state and vice versa. Different transition delays could lead to overlapping on-state intervals or overlapping off-state intervals for the charging switches. If in each PWM period, T, there is an overlap interval, $t_{overlap}$, for the charging switches, the full-scale error will be $$\epsilon_{full-scale} = \left(1 - \frac{\delta R}{R}\right) \frac{t_{overlap}}{T} \quad (14)$$

Figure 6C:
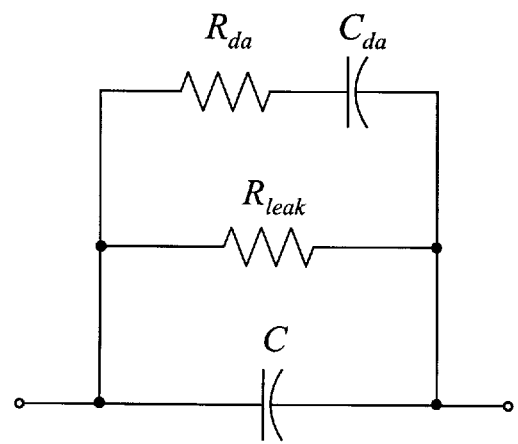
FIG. 6c is a model of an integrating capacitor.

Leakage and dielectric absorption properties of the integrating capacitor 69 with capacitance $C_1$ and the low-pass filter capacitor 70 with capacitance $C_2$ can be modeled as illustrated in FIG. 6c. The leakage resistance $R_{leak1}$ of capacitor 69 causes a frequency-dependent error of $$\epsilon_{full-scale} \cong -\frac{T}{R_{leak1}C_1}\left(\frac{M}{T}\right)_{ideal} - \frac{R}{4R_{leak1}} \quad (15)$$

while the leakage resistance $R_{leak2}$ of capacitor 70 leads to a frequency-independent error of $$\epsilon_{full-scale} \cong \frac{R}{2R_{leak2}}\left(\frac{R}{r} + 1\right)\left(1 - \frac{\delta R}{R}\right) \quad (16)$$

The dielectric absorption components ($R_{da1}$, $C_{da1}$, $R_{da2}$, $C_{da2}$) do not affect the conversion accuracy in the steady state, i.e., when $\delta R$ is not changing with time.

Since capacitors 69 and 70 should form equal time constants with their source resistances, there are trade-offs in choosing these capacitors because of (9), (11) and (15). These trade-offs will be discussed in greater detail below.

Calibration can be used to remove all the above errors for the system of FIG. 6a. However, the performance of the system may deteriorate should any of the relevant parameters drift with time or temperature. Bridge supply switching can be used as an effective method for cancelling some of the important errors over a wide range of temperatures and this method of error cancellation will be independent of parameter drift with time.

Figure 7:
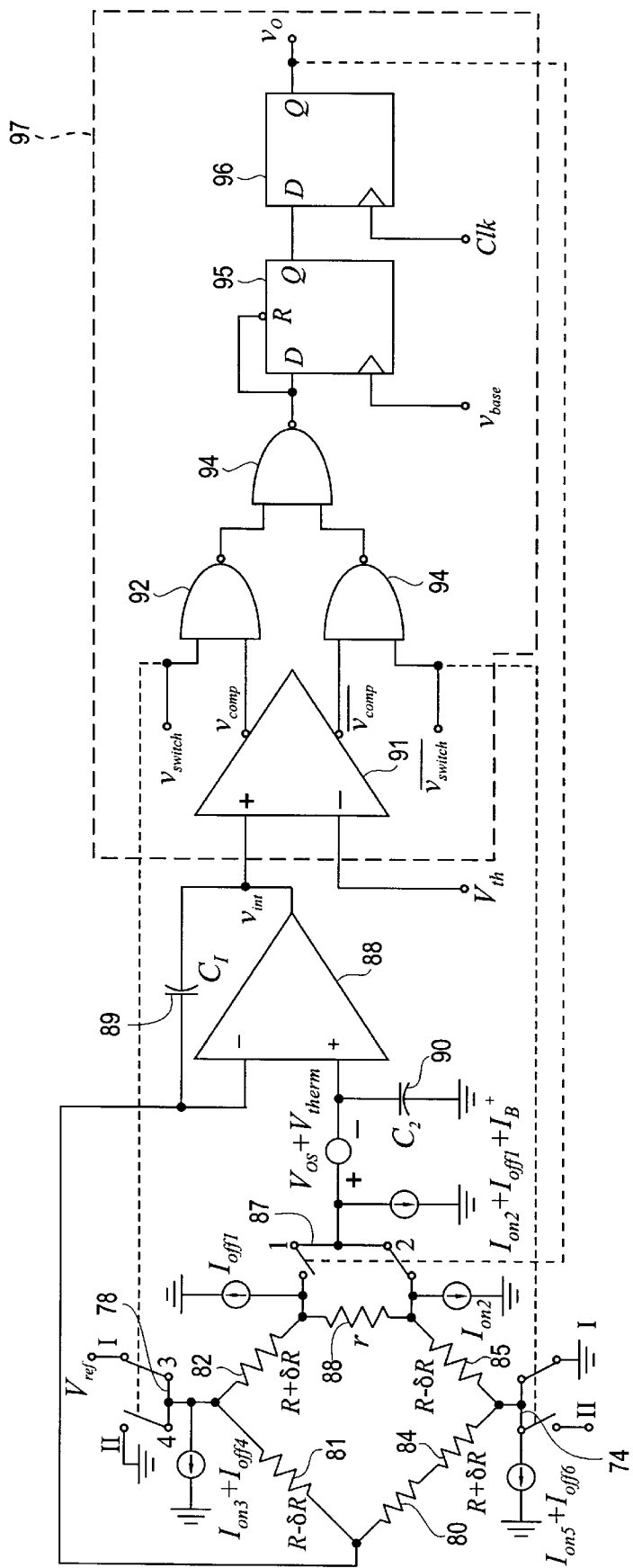
FIG. 7 is a schematic diagram of a resistance bridge δR-to-digital converter according to the principles of the invention.

A $\delta R$-to-digital conversion system with bridge supply switching is shown in FIG. 7. As with FIG. 6a, differential voltages $V_{od1}$ and $V_{od2}$, given by (2) and (3) are alternately applied by switch 87 to an integrating op-amp 88 and digital pulses are formed generally by pulse-forming circuit 97. The pulse-forming circuit 97 contains a comparator 91, which converts the analog signal $V_{int}$ into a digital signal. The period and the mark/space ratio of the waveform generated by the comparator 91 are determined and synchronized to a high frequency clock CLK by a first flip-flop 95 and a second flip-flop 96, respectfully.

In order to eliminate the errors discussed above, $V_{switch}$ and $\overline{V_{switch}}$ signals switch the nodes between resistors 81 and 82, and 84 and 85, between $V_{ref}$ and ground respectively. As shown, with switch 78 at position 3 (and connected to $V_{ref}$), switch 74 is at position 5 (and connected to ground). On the other hand, with switch 78 at position 4 (and connected to ground), switch 74 is at position 6 (and connected to $V_{ref}$).

Figure 8:
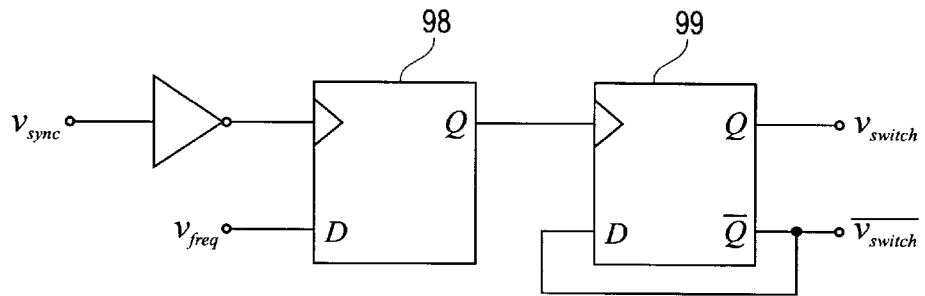
FIG. 8 is a schematic diagram for a circuit that generates switching signals according to the principles of the invention.
Figure 9:
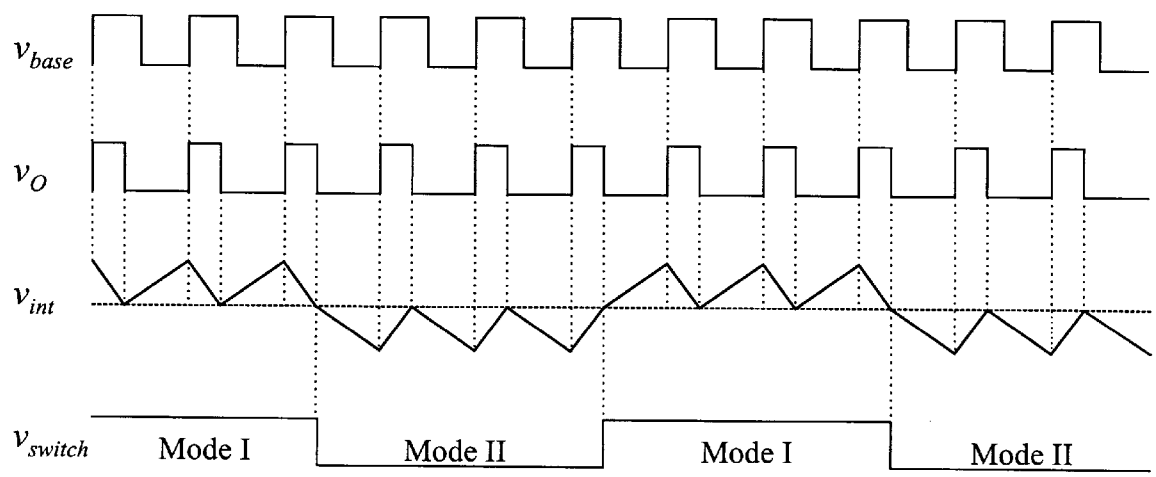
FIG. 9 is a timing diagram for the switched-supply modified bridge and pulse-width-modulator waveforms according to the principles of the invention.

As shown in FIG. 8, two flip-flops 98 and 99 generate $V_{switch}$ and $\overline{V_{switch}}$ by synchronizing $V_{freq}$, a signal at twice the bridge switching frequency, with the threshold crossings of an integrating op-amp 88. As shown in FIG. 9, the switching (between modes I and II) occurs when $V_{int}$ crosses and recrosses the threshold voltage.

Since switching changes the sign of the differential input voltage to the integrating op-amp 88, the gain of the direct path of the loop must be changed as well to maintain proper operation of the pulse-forming circuit 97 and this gain reversal is provided by NAND gates 92, 93 and 94 in the digital portion of the modulator. The switching points between the two modes of operation must be synchronized with the threshold-crossing points of the integrator output, $V_{int}$, to minimize switching transients as shown in FIG. 9.

In the switched supply modified bridge configuration of FIG. 7, the errors due to $V_{therm}$, $V_{os}$, $I_B$, $I_{os}$, and the CMRR of the op-amp are cancelled. Furthermore, the converter accuracy is insensitive to the gain bandwidth product (GBWP) and the output resistance $R_o$, of the op-amp. The offset portion of the error due to the finite low-frequency gain of the op-amp given by (9) is removed by bridge supply switching and only the gain portion of the error remains to give $$\epsilon_{full-scale} \cong -\frac{2T}{A_0 R C_1}\left(\frac{M}{T}\right)_{ideal} \quad (17)$$

The error due to the leakage currents of the charging switches given above is removed by bridge supply switching as long as the off-state leakage currents ($I_{off1}$ and $I_{off2}$) are matched, the on-state leakage currents ($I_{on1}$ and $I_{on2}$) are matched, R>>$\delta$R, and R>>r. Even if none of the above conditions are valid, the full-scale error due to leakage currents and due to mismatch in leakage currents of the charging switches is relatively small. The switched supply configuration is also capable of removing the errors due to overlapping switching times of the charging switches. Furthermore, bridge switching suppresses circuit noise if the noise components have a frequency much less than the switching frequency.

The offset errors due to the leakage resistances of the integrating capacitor 89 and low-pass filter capacitor 90 are cancelled by switching the bridge supply [see (15) and (16)].

Only the gain errors due to these nonidealities remain and are given by $$\epsilon_{full-scale} \cong \frac{T}{R_{leak1}C_1}\left(\frac{M}{T}\right)_{ideal} \quad (18)$$

$$\epsilon_{full-scale} \cong -\left(\frac{R}{r}+1\right)\frac{\delta R}{2R_{leak2}} \quad (19)$$

The accuracy of the converter is independent of the "on" resistance and the leakage current of the bridge supply switching switches and also the comparator offset voltage and hysteresis.

Since the pulse-width modulator shown in FIG. 7 operates only in the range $0<M/T<½$, based on (5), $\delta R$ should always be a positive value. Furthermore, resistor 80 should be chosen in such a way that the circuit errors, such as bridge unbalance, thermoelectric voltages and op-amp nonidealities are not capable of moving the operating point of the modulator outside the region $0<M/T<½$. Assuming that the maximum deviation of each bridge arm resistance (when $\delta R=0$) from the ideal value R is $\Delta R$ and assuming an equivalent input offset voltage of $V'_{os}$ (representing all the nonidealities of the op-amp, the switches and the capacitors and also the thermoelectric voltage of the bridge), the operation in the stable region is guaranteed provided $$R' > 4R\left(\frac{V'_{os}}{V_{ref}}+\frac{\Delta R}{R}\right) \quad (20)$$

A choice of resistor 86 such that $$r = 4(\delta R)_{max} + 2R' \quad (21)$$

will result in the optimum resolution. Furthermore, resistors 86 and 80 should satisfy $$(\delta R)_{max} < \frac{R(r-R')}{4R+R'+r} \quad (22)$$

to ensure that the differential voltages $V_{od1}$ and $V_{od2}$ of FIG. 4 are different in sign.

Table I summarizes the maximum full-scale error due to each circuit nonideality. Although the converter is insensitive to most of the component parameters, careful selection of the circuit components is still required to minimize the residual errors. Among the uncancelled errors, the ones due to the differential delay, $\Delta t$, the finite dc gain of the op-amp, $A_o$, and the leakage resistance of the integrating capacitor, $R_{leak}$, are the most important. Differential temporal error can be reduced by increasing the PWM period or reducing the size of the charging switches. On the other hand, the errors due to the finite dc gain of the op-amp and the leakage resistance of the integrating capacitor can be decreased by a reduction in $T/C_1$. Since the maximum swing at the output of the integrator is given by $$v_{int(max)} = \frac{T}{2\left(\frac{2R}{r}+1\right)RC_1} V_{ref} \quad (23)$$

insensitivity to $A_o$ and $R_{leak1}$ can only be achieved for small swings of the integrator output. Any reduction in $T/C_1$, would lead to a larger error due to the charging switch "on" resistance mismatch ($\Delta R_{on}$). Since bridge supply switching is capable of removing the bulk of the errors due to the leakage current of the charging switches, the "on" resistance matching can be achieved by enlarging the switch W/L. The error due to the leakage resistance of the low-pass filter capacitor, $R_{leak2}$, is usually negligible.

Thus, a resistance bridge $\delta R$-to-digital conversion system with a performance independent of most passive and active component parameter variations is provided. The system of FIG. 7 also provides good resolution and noise rejection. It is stable with temperature and relatively immune to component aging.

An integrated modulator according to the principles of the present invention containing an op-amp, a comparator, switches, and other digital functions was fabricated on 1.2 μm-CMOS process. The die area excluding the bonding pads was approximately 2.25 mm².

The op-amp designed for the modulator consisted of two stages. A folded-cascode design with a high-swing cascode current mirror was chosen as the input stage of the op-amp, because of its large dc gain. To provide the required current to drive the bridge, a class-AB push-pull output stage was used.

Figure 10:
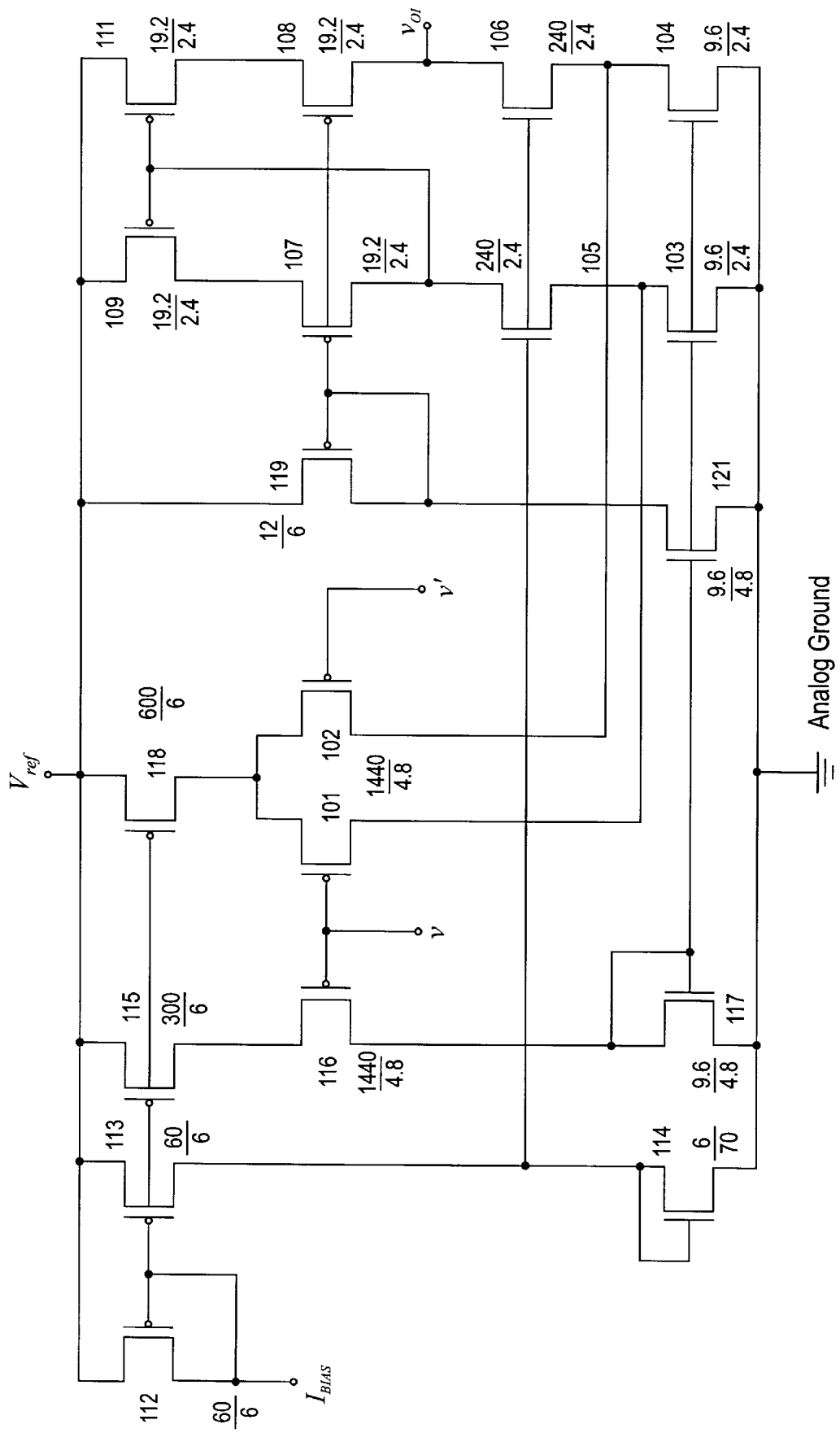
FIG. 10 is a diagram of an implementation of the input stage of the op-amp according to the principles of the invention.

FIG. 10 illustrates the circuit diagram of the first stage of the op-amp. Transistors 101, 102, 105, and 106 constitute a pair of cascode amplifiers. Transistors 107, 108, 109 and 111 are the elements of a high-swing cascade current mirror. The biasing circuit consists of transistors 103, 104, 112–119 and 121.

Figure 11:
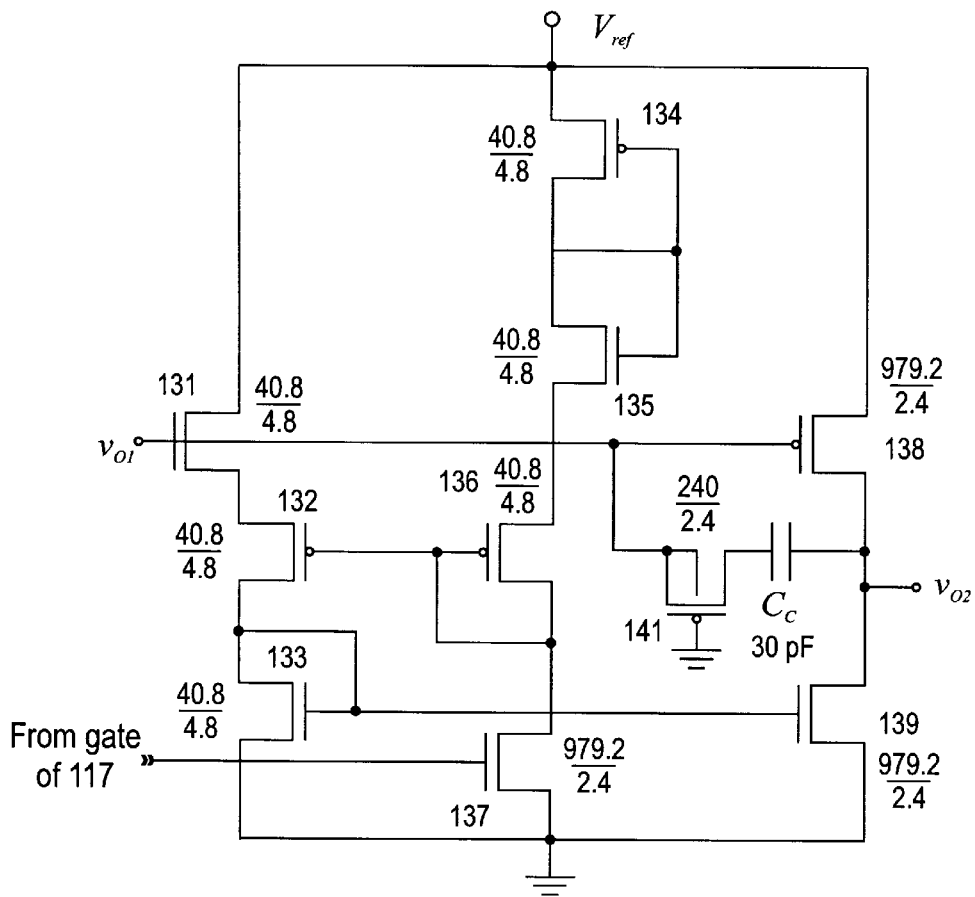
FIG. 11 is a diagram of an implementation of the output stage of the op-amp according to the principles of the invention.

As shown in the FIG. 11, and according to principles of the present invention, the second stage of the op-amp is a class-AB push-pull stage. Transistor 138 is driven directly by the input signal while transistor 139 uses the input signal, but after a level shifting by transistors 131–133. Transistors 134–137 provide the required dc operating conditions of the output stage.

Figure 12:
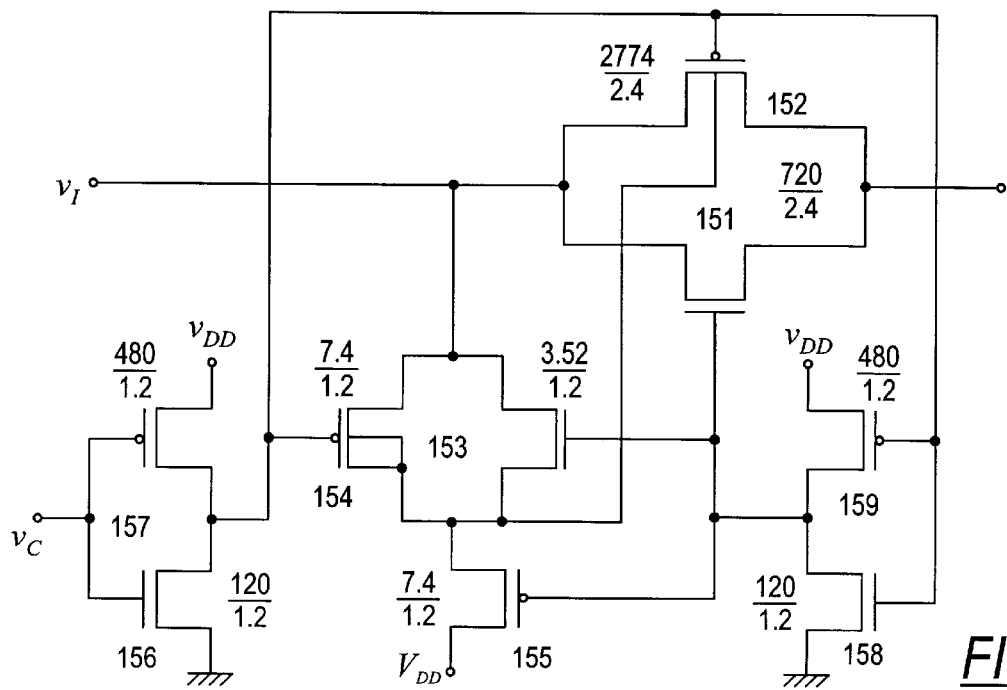
FIG. 12 is a diagram of an implementation of the switch according to the principles of the invention.

FIG. 12 shows the schematic diagram of an analog switch used for both charging and bridge supply switching in FIG. 7. The transmission gate formed by two large transistors 151 and 152 provides good on-resistance matching for various input values. To provide a good isolation in the "off" state and a low "on" resistance in the "on" state for the PMOS transistor 152, its substrate is switched between the input and the supply voltage by transistors 153–155. Two fairly large inverters consisting of transistors 156–159 provide the control signals $V_C$ and $\overline{V}_c$.

Figure 13:
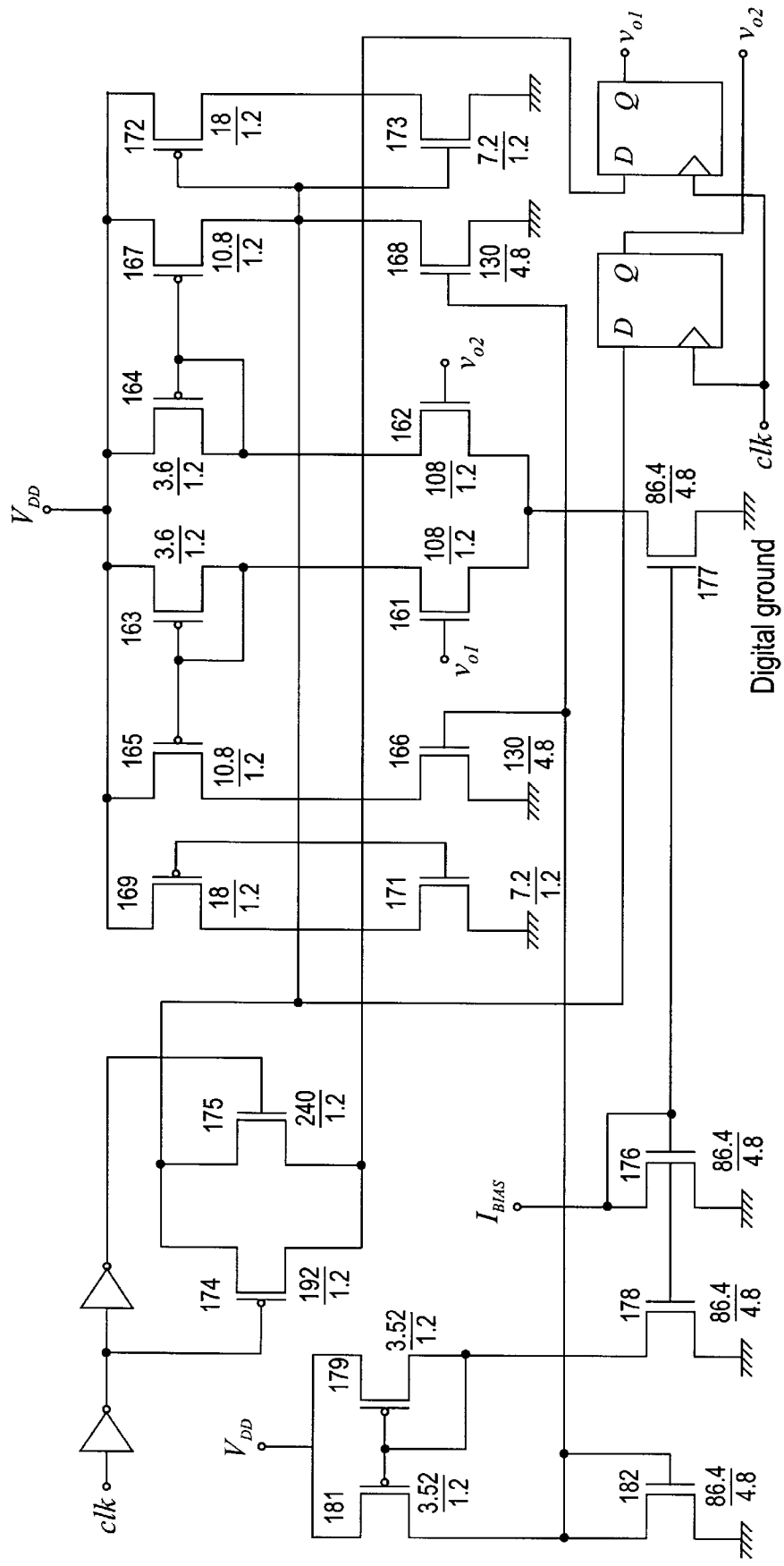
FIG. 13 is a diagram of an implementation of the comparator according to the principles of the invention.

A schematic diagram of a high-speed strobed comparator according to principles of the present invention with a relatively broad input common-mode range is shown in FIG. 13. The comparator consists of a differential input stage (transistors 161–168) followed by two inverters (transistors 169–173) connected as a latch. When the switch consisting of transistors 174 and 175 is closed, the input and output of the latch are shorted together and the latch settles at its high-gain operating point. At the sampling instant, the switch opens and the outputs $v_{o1}$ and $v_{o2}$ go to low and high states, depending on the sign of the differential input to the comparator. Buffering of the main current source formed by transistor 176, by additional current mirrors formed by transistors 178–182 isolates the current of the differential stage from the large swings at the outputs of the circuit. Further reduction of the transients on the inputs of the comparator has been achieved by using a complementary switch.

Thus, an integrated version of the circuit of FIG. 7 was achieved that has a performance independent of most passive and active component parameter variations, good resolution and noise rejection, that is stable with temperature, and relatively immune to component aging.

Both integrated and discrete implementations of the bridge $\delta R$-to-digital conversion systems were tested at different temperatures to evaluate their performances. A TLC2652CN op-amp, an ALD2301BDA comparator, MC54HC4066 analog switches, 54HC00 digital parts, and 100 nF ceramic-cased capacitors were used in the discrete implementation. To obtain a reliable reference for measuring the stability of the conversions with temperature, a custom bridge (with a TCR of ±5 ppm/°C.) was placed in a constant temperature bath in which the temperature was kept constant to within 0.01° C. At the same time, the temperature of the modulator was varied over a range from −55° C. to 175° C. in increments of 25° C. The output of the pulse-width modulator was interfaced to a PC using a custom-made data acquisition card. A finite impulse response (FIR) digital filter was implemented in software to extract a measure of δR/R.

Figure 14:
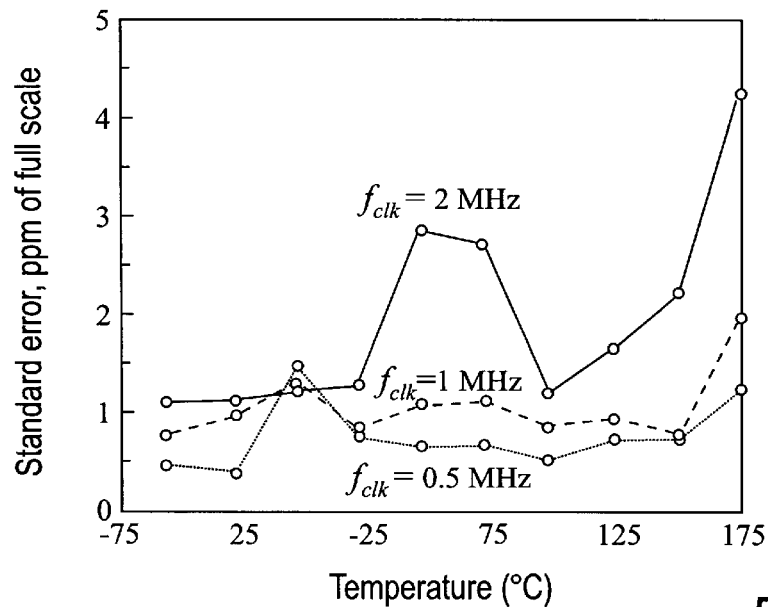
FIG. 14 is a graph of the standard error of a discrete modulator.

FIG. 14 shows the standard deviation of conversions of the discrete implementation of the modulator with a clock frequency of 2 MHz, a conversion time of 3 s, one supply switching per conversion and a $sinc^1$ (f) filter.

Figure 15:
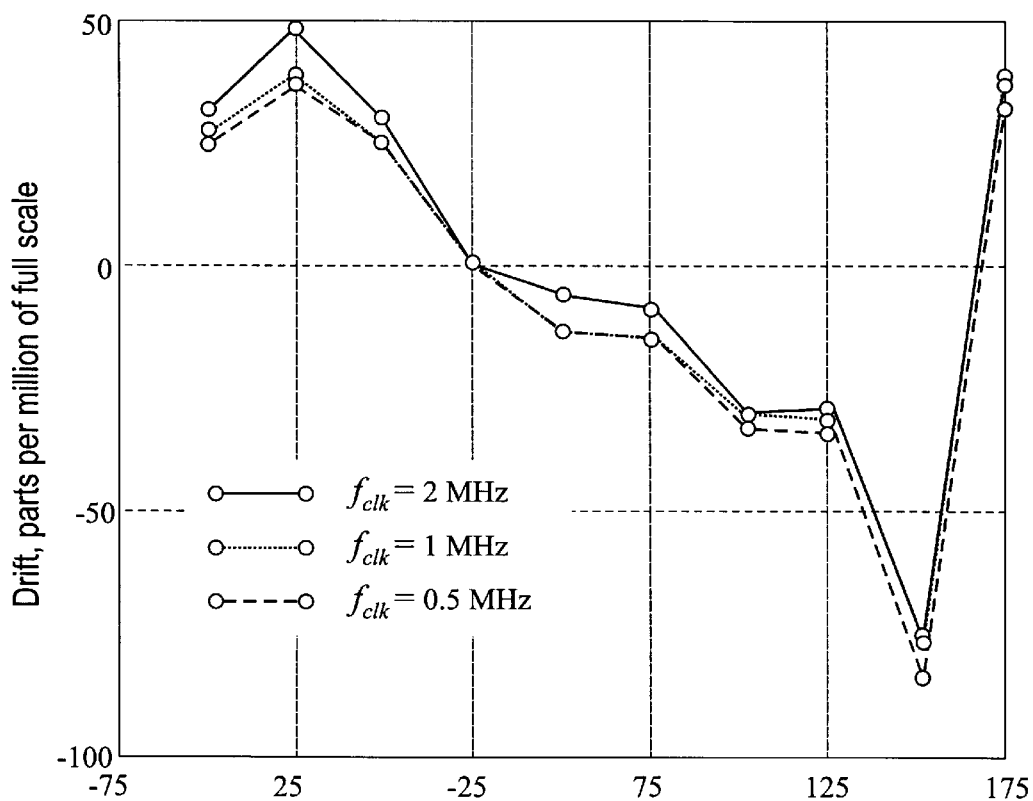
FIG. 15 is a graph of drift versus temperature for a $\delta R$-to-digital converter for different values of $f_{clk}$.

FIG. 15 shows the drift in the output readings at different temperatures from the output reading at 25° C. for the discrete modulator. In this measurement, it was necessary to use a conversion of 3 seconds and an average of 20 conversions to properly delineate the very small drift with temperature. As can be seen from this graph, the temperature coefficient of the drift in the output readings is about 0.5 ppm of the bridge full scale per Celsius degree over a temperature range of −55° C. to 175° C. Since in this experiment the modified bridge has a full-scale output voltage of about 250 mV, one part per million of full scale corresponds to about 250 nV.

Figure 16:
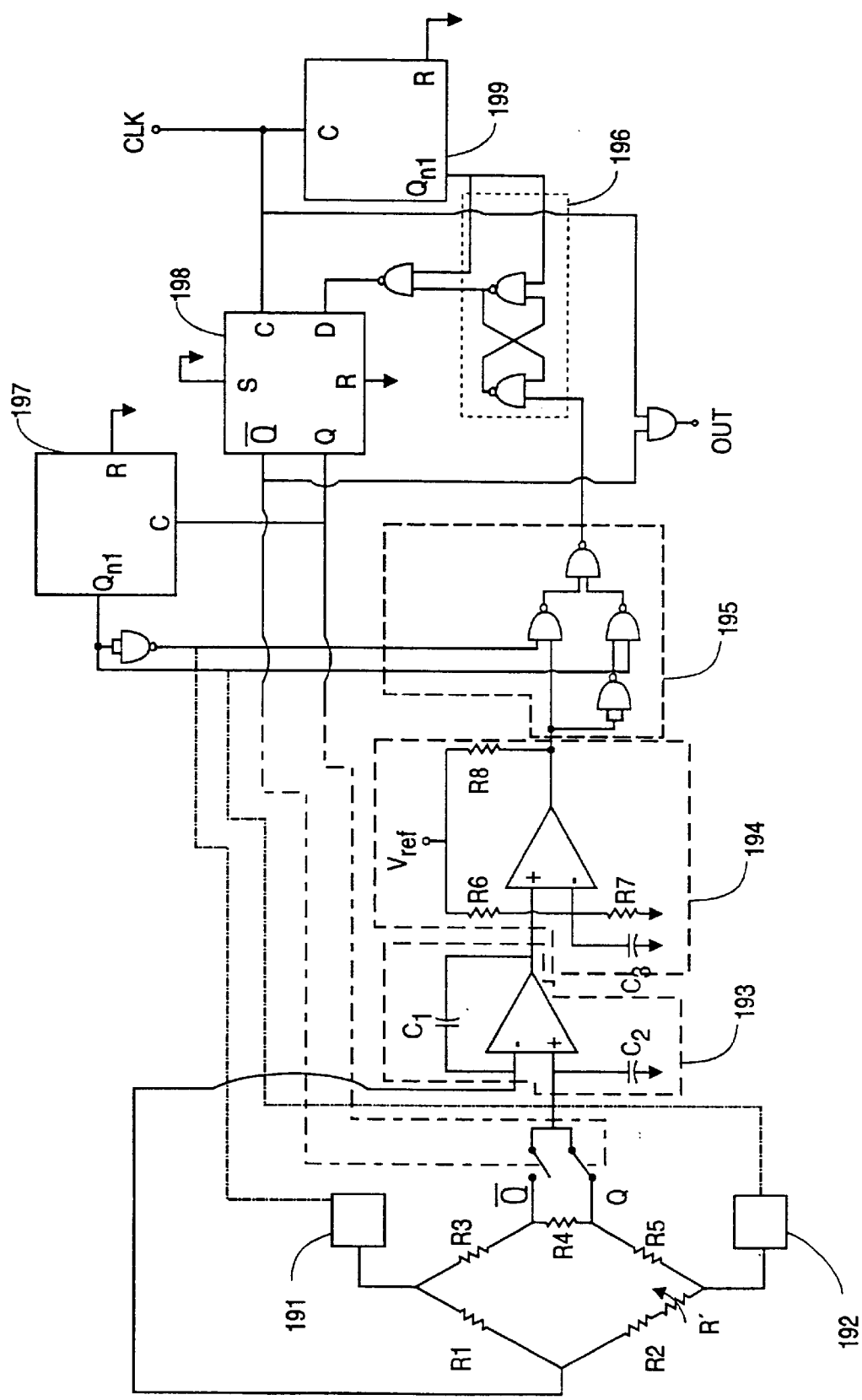
FIG. 16 is a schematic diagram of a resistance bridge $\delta R$-to-digital converter according to the principles of the invention.

FIG. 16 shows a δR-to-digital conversion system constructed with a PWM. As shown and as discussed above, a δR is created in some or all of the resistors in the bridge which also creates differential voltages on either side of resistor R4. Integration circuitry 193 then converts the differential voltages into a ramped signal. Next, comparator circuitry 194 converts the ramped signal into a digital form, and gain reversal circuitry 195 reverses the gain when the bridge supply is switched. Latch 196 and flip-flop 198 then determine the period and synchronize the digital signal at OUT. Bridge voltage supply control circuitry at 191 and 192 can either be an inverter drive or a switched bridge drive. For the circuit of FIG. 16., the values used were R1=10 KΩ; R2=9.25 KΩ; R3=9 KΩ; R4=1 KΩ; R5=10 KΩ; R6=R7= 100 KΩ; R8=10 KΩ; $C_1=C_2=4.7$ nF; and $C_3=100$ nF.

Figure 17:
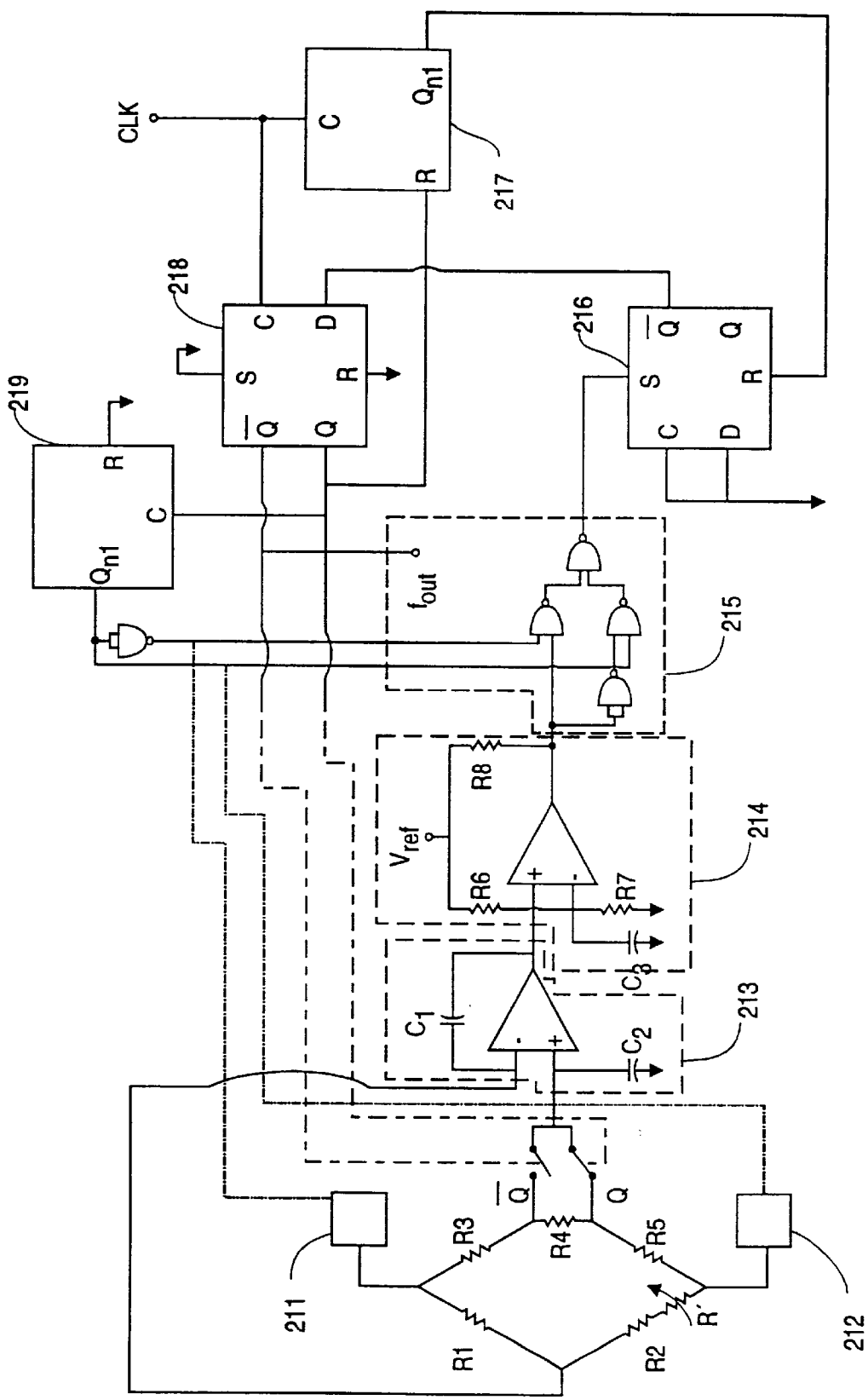
FIG. 17 is a schematic diagram of a resistance bridge $\delta R$-to-digital converter according to the principles of the invention; and TABLE 1 is a table of the errors present in the circuit of FIG. 7.

FIG. 17 shows a δR-to-digital conversion system containing a voltage-to-frequency converter. As shown and as discussed above, a δR is created in some or all of the resistors in the bridge which also creates differential voltages on either side of resistor R4. Integration circuitry 213 then converts the differential voltages into a ramped signal. Next, comparator circuitry 214 converts the ramped signal into a digital form, and gain reversal circuitry 215 reverses the gain when the bridge supply is switched. Flip-flops 216 and 219 then determine the mark and synchronize the digital signal at $f_{out}$. Bridge voltage supply control circuitry at 211 and 212 can either be an inverter bridge drive or a switched bridge drive. For the circuit of FIG. 17. the values used were R1=10 KΩ; R2=9.25 KΩ; R3=9 KΩ; R4=1 KΩ; R5=10 KΩ; R6=R7=100 KΩ; R8=10 KΩ; $C_1=C_2=4.7$ nF; and $C_3=100$ nF.

Thus, the invention provides a bridge which can be used with pulse generating circuitry. Those skilled in the art will readily recognize that these and various other modifications and changes may be made to the present invention without strictly following the exemplary application illustrated and described herein and without departing from the true spirit and scope of the present invention, which is set forth in the following claims.

We claim:

1. An electrical network for creating differential voltage signals comprising:

four impedance elements of substantially equal values, two of said four impedance elements connected at a first junction to form a first impedance pair and two others of said four impedance elements connected at a second junction to form a second impedance pair, each of said pairs having first and second ends, the impedance of at least one of said four impedance elements changing in response to an external force to which said four impedance elements are exposed, said first and second impedance pairs connected at said first ends;

a reference voltage coupled to said first junction of said first impedance pair;

a grounding voltage coupled to said second junction of the second impedance pair;

an additional impedance element having first and second nodes and having a value substantially less than said four impedance elements, said first node of said additional impedance element coupled to said second end of said first impedance pair and said second node of said second impedance element coupled to said second end of the said second impedance pair, creating a first differential voltage between a first voltage of said first end of said additional impedance element and said first ends of said first and second impedance pairs and a second differential voltage between a second voltage of the second node of said second impedance element and said first ends of said first and second impedance pairs;

switching means for alternatively selecting between said first and second differential voltages;

integrating means coupled to said first ends and said switching means and having an output for receiving said selected differential voltages and for producing an integrated output voltage with a value representing an integral of said selected differential voltages; and a pulse-forming circuit coupled to said output of said integrating means for forming a series of digital pulses from said integrated output of said integrating means, said digital pulses fed back to control said switching means.

2. The electrical network of claim 1 wherein:

said integrating means produces said integrated output voltage having a ramped waveform and includes a first capacitor which is charged at a first rate proportional to said positive first differential voltage and discharged at a second rate proportional to said negative second differential voltage, said charging occurring during a first time interval and said discharging occurring during a second time interval;

said pulse-forming circuit includes level detection means having an output and an input for receiving a predetermined voltage level responsive to said integrating means output for causing a signal at said output of said detection means to switch alternatively between a first and second state when said value of said integrating means output voltage reaches said predetermined voltage level;

wherein said switching means is responsive to the output of said level detection means for switching the input of said integrating means between said positive first and negative second differential voltages.

3. The electrical network of claim 2 wherein said pulse-forming circuit further comprises:

a clock with a first period;

timing means for adjusting a second period of the output of said level detection means; wherein said second period consisting of a sum of said integrating means charging and discharging intervals, and synchronizing means for synchronizing said output of said level detection means to said clock.

4. The electrical network of claim 3 wherein each of said four impedance elements has a value and said value of each of said four impedance elements is varied by temperature changes.

5. The electrical network of claim 3 wherein said timing means comprise a first flip-flop for adjusting said output period to an integer multiple of the first period of said clock.

6. The electrical network of claim 5 wherein said synchronizing means comprises a second flip-flop having an output which is synchronized to said clock.

7. The electrical network of claim 6 further includes bridge supply switching means respectively coupling said reference voltage and said grounding voltage to said first and second junctions for providing third and fourth differential voltages.

8. The electrical network of claim 7 wherein said bridge supply switching means are responsive to a control voltage.

9. The electrical network of claim 8 wherein said integrating means further has an transfer function and wherein said integrating means contains a second capacitor for removing a zero from said transfer function of said integrating means.

10. A $\Delta R$-to-digital conversion system comprising:

four impedance elements of substantially equal values, two of said four impedance elements connected at a first junction to form a first impedance pair and two others of said four impedance elements connected at a second junction to form a second impedance pair, each of said pairs having first and second ends, the impedance of at least one of said four impedance elements changing in response to an external force to which said four impedance elements are exposed, said first and second impedance pairs connected at said first ends;

a reference voltage connected to said first junction of said first impedance pair;

a grounding voltage coupled to said second junction of said second impedance pair;

an additional impedance element having first and second nodes and having a value substantially less than said four impedance elements, said first node of said additional impedance element coupled to said second end of said first impedance pair and said second node of said second impedance element coupled to said second end of the said second impedance pair, creating a first differential voltage between a first voltage of said first node of said additional impedance element and said first ends of said first and second impedance pairs and a second differential voltage between a second voltage of the second node of said second impedance element and said first ends of said first and second impedance pairs;

switching means for alternatively selecting between said first and second differential voltages;

integrating means coupled to said first ends and said switching means and having an output for receiving said selected differential voltages to produce an output voltage with a value representing an integral of said selected differential voltages; and a pulse-forming circuit coupled to said output of said integrating means for forming a series of digital pulses from said output of said integrating means, said digital pulses fed back to control said switching means;

bridge supply switching means respectively coupling said reference signal and said grounding voltage to said first and second junctions for providing third and fourth differential voltages.

11. The system of claim 10 wherein said pulse-forming circuit wherein:

said integrating means produces said output voltage having a ramped waveform and includes a first capacitor which is changed at a first rate proportional to said first differential voltage and discharged at a second rate proportional to said negative second differential voltage, said charging occurring during a first time interval and said discharging occurring during a second time interval;

said pulse-forming circuit includes level detection means having an output and an input for receiving a predetermined voltage level responsive to said integrating means output for causing a signal at said output of said detection means to switch alternatively between a first and second state when said value of said integrating means output voltage reaches said predetermined voltage level; and wherein said switching means is responsive to the output of said level detection means for switching the input of said integrating means between said first and second differential voltages.

12. The system of claim 11 wherein said pulse-forming circuit further comprises:

a clock with a first period;

timing means for adjusting a second period of the output of said level detection means; said second period consisting of a sum of said integrating means charging and discharging intervals, and synchronizing means for synchronizing said output of said level detection means to said clock.

13. The system of claim 12 wherein said pulse-forming circuit is a pulse width modulator.

14. The system of claim 13 wherein said pulse-forming circuit is a voltage-to-frequency converter.

15. A method for converting a $\Delta R$ into a digital signal comprising the steps:

providing four impedance elements of substantially equal values;

connecting two of said four impedance elements at a first junction to form a first impedance pair and connecting two others of said four impedance elements at a second junction to form a second impedance pair, said pairs having first and second ends;

connecting said first and second impedance element pairs at said first ends;

connecting a reference voltage to said first junction of said first impedance pair;

connecting a grounding voltage to said second junction of said second impedance pair;

exposing said four impedance elements to an external force;

providing an additional impedance element having first and second nodes and having a value substantially less than said four impedance elements;

coupling said first node of said additional impedance element to said second end of said first impedance pair and said second node of said additional impedance element to said second end of the said second impedance pair;

generating a first differential voltage signal between a first voltage of said first node of said additional impedance element and said first ends of said first and second impedance pairs and a second differential voltage between a second voltage of the second node of said additional impedance element and said first ends of said first and second impedance pairs;

alternatively selecting between said first and second differential voltages with a switching means;

producing an integrated output representing an integral of said selected differential voltages;

forming a series of digital pulses from said integrated output; and feeding back said digital pulses to control said switching means.

16. A method for converting a ΔR into a digital signal comprising the steps:

providing four impedance elements of substantially equal values;

connecting two of said four impedance elements at a first junction to form a first impedance pair and connecting two others of said four impedance elements at a second junction to form a second impedance pair, said pairs having first and second ends;

connecting said first and second impedance element pairs at said first ends;

connecting a reference voltage coupled to said first junction of said first impedance pair;

connecting a grounding voltage to said second junction of said second impedance pair;

exposing said four impedance elements to an external force;

providing an additional impedance element having first and second nodes and having a value substantially less than said four impedance elements;

coupling said first node of said additional impedance element to said second end of said first impedance pair and said second node of said additional impedance element to said second end of the said second impedance pair;

generating a first differential voltage signal between a first voltage of said first node of said additional impedance element and said first ends of said first and second impedance pairs and a second differential voltage between a second voltage of the second node of said additional impedance element and said first ends of said first and second impedance pairs;

alternatively selecting between said first and second differential voltages with a switching means;

producing an output signal representing an integral of said selected differential voltages;

forming a series of digital pulses from said output signal;

alternatively switching said reference voltage and said grounding voltage between said first junction and second junction; and feeding back said digital pulses to control said switching means.

17. A ΔR-to-digital conversion system comprising:

four impedance elements of substantially equal values, two of said four impedance elements connected at a first junction to form a first impedance pair and two others of said four impedance elements connected at a second junction to form a second impedance pair, each of said pairs having first and second ends, the impedance of at least one of said first impedance elements changing in response to an external force to which said four impedance elements are exposed, said first and second impedance pairs connected at said first ends;

a reference voltage coupled to said first junction of said first impedance pair; and a grounding voltage coupled to said second junction of the second impedance pair;

an additional impedance element having first and second nodes and having a value substantially less than said four impedance elements, said first node of said additional impedance element coupled to said second end of said first impedance pair and said second node of said additional impedance element coupled to said second end of the said second impedance pair, creating a first differential voltage between a first voltage of said first end of said additional impedance element and said first ends of said first and additional impedance pairs and a second differential voltage between a second voltage of the additional node of said second impedance element and said first ends of said first and second impedance pairs;

switching means for alternatively selecting between said first and second differential voltages;

integrating means coupled to said first ends and said switching means and having an output for producing ramped signal having a value representing an integral of said selected differential voltages, said integrating means includes a capacitor which is charged at a rate proportional to said first differential voltage and discharged at a rate proportional to said second differential voltage, said charging occurring during a first time interval and said discharging occurring during a second time interval;

a pulse-forming circuit coupled to said output of said integrating means for forming a series of digital pulses, said digital pulses fed back to control said switching means, wherein said pulse-forming circuit includes level detection means responsive to a predetermined voltage level for alternatively switching between a first and second state when said ramped signal from said integrating means reached said predetermined voltage level;

a clock with a first period;

timing means for adjusting a second period of an output of said detection means and synchronizing means for synchronizing said output of said detection means to said clocks, wherein said timing means comprise a first flip-flop for adjusting the second period to an integer multiple of the first period of said clock and wherein said synchronizing means generates said series of digital pulses having a pulse width corresponding to said discharging interval, said synchronizing means comprising a second flip-flop having an output synchronized to said clock; and bridge supply switching means respectively coupling said reference voltage and said grounding voltage to said first and second junctions for providing third and fourth differential voltages.

* * * * *